United States Patent [19]
McKeen et al.

[11] Patent Number: 5,914,858
[45] Date of Patent: Jun. 22, 1999

[54] BAFFLE ARRANGEMENT FOR AN AIRFLOW BALANCE SYSTEM

[75] Inventors: Wilbert John McKeen, Ottawa; Steven James Rhodes, Nepean, both of Canada

[73] Assignee: Northern Telecom Limited, Montreal, Canada

[21] Appl. No.: 08/969,298

[22] Filed: Nov. 13, 1997

[51] Int. Cl.⁶ .............................. H05K 7/20; F24F 7/007
[52] U.S. Cl. ................ 361/695; 361/694; 361/692; 361/690; 165/80.3; 454/186
[58] Field of Search .................. 361/676, 678, 361/687, 690, 692, 694, 695; 165/80.3, 104.34; 454/184, 185, 186

[56] References Cited

U.S. PATENT DOCUMENTS

| | | | |
|---|---|---|---|
| 3,903,404 | 9/1975 | Beall et al. | 235/152 |
| 3,967,874 | 7/1976 | Calabro | 39/112 R |
| 4,399,485 | 8/1983 | Wright et al. | 361/383 |
| 4,860,163 | 8/1989 | Sarath | 361/384 |
| 4,894,749 | 1/1990 | Elko et al. | 361/383 |
| 5,210,680 | 5/1993 | Scheibler | 361/384 |
| 5,375,038 | 12/1994 | Hardt | 361/694 |
| 5,563,768 | 10/1996 | Perdue | 361/695 |

FOREIGN PATENT DOCUMENTS

| | | |
|---|---|---|
| 0469187A1 | 5/1992 | European Pat. Off. . |
| 2197536 | 5/1988 | United Kingdom . |

Primary Examiner—Leo P. Picard
Assistant Examiner—Anatoly Vortman

[57] ABSTRACT

A baffle arrangement, interposed between a series of modules of electronic components and a fan, helps to improve the evenness of flow of air drawn through the components by the fan. The baffle arrangement comprises a series of channels. A first half of the channels runs from one end of the series of modules, across approximately half of the modules. A second half of the channels runs from approximately half-way across the series of modules to the other end of the series of modules. There is a gap between each channel and an adjacent channel of approximately the width of a channel. The first half of the channels is offset from the second half of the channels by approximately the width of a channel such that no channel from the first half of channels is collinear with a channel from the second half of channels. Air drawn up from a module into a channel must flow along the channel to the end of the channel (approximately midway across the series of modules) before being drawn into the fan.

13 Claims, 10 Drawing Sheets

BAFFLE ARRANGEMENT FOR AN AIRFLOW BALANCE SYSTEM

FIELD OF THE INVENTION

The invention relates to a system for cooling modules containing electronic components and is particularly concerned with a system for producing even or balanced airflow across the electronic components.

BACKGROUND OF THE INVENTION

In electronics systems, electronic components such as printed circuit boards are often housed in modules having holes in their top and bottom portions to allow for air circulation through the components for cooling purposes. The modules tend to be arranged vertically, side-by-side and housed within a cabinet or chassis.

Typically, the cooling air is provided by fans which are placed in a permanent, fixed location inside the cabinet.

Traditionally the system is made non-redundant for cooling. In other words, if any of the fans in the system fails, the system must shut down. For example, if the system relies upon two fans, and one fan fails, then in a typical system, the remaining fan is unable to create sufficient airflow through the entire electronics system to adequately cool the entire system. The insufficiently heated portion of the system will burn out if the system is not shut down.

Some systems are made redundant for cooling. In other words, the system can continue to operate even if one fan fails. In such redundant systems, the airflow throughout the system is maintained above a minimum flow rate in order to keep any part of the system from over-heating. One method for creating a redundant system is to add more fans. However, the addition of fans increases the cost of the system and may not be possible or practical where space is limited.

The prior art reveals complicated techniques to help improve the evenness of airflow through electronics systems. For example, UK patent application 2,197,536, in the name of STC plc and published on May 18, 1988, describes an equipment cabinet having a central chimney or spine in the centre, surrounded by electronic circuit units. The units are stacked vertically. By a complicated arrangement of air intake areas, baffles, and inlets into the chimney, the cabinet helps to evenly distribute airflow through the units. However, this invention requires a specially built cabinet and chimney structure and requires the ability to stack electronic component units vertically, which, given space constraints may not be possible or desirable in many electronics systems.

A simpler device for improving airflow through electronic modules is described in U.S. Pat. No. 4,860,163 which was issued to Sarath on Aug. 22, 1989. The Sarath device describes a cabinet for holding circuit board modules, with a fan drawing air at one end of the cabinet. There is a wall at the end of the modules closest to the fan preventing air from flowing directly from the modules to the fan. Instead, air must flow out the side of the modules and around the wall to reach the fan. To prevent air from simply flowing out the side of the modules without flowing over the surface of the modules, baffles are placed along a portion of the sides of the modules to force air to flow over at least a portion of the modules. While this device does cause air to flow over some portion of the modules, it does not cause air to flow evenly over all areas of the modules, which may lead to uneven cooling.

SUMMARY OF THE INVENTION

It is an object of the invention to obviate or mitigate one or more of the above identified disadvantages.

According to a first broad aspect, the invention provides a baffle arrangement to help increase the evenness of distribution of air drawn by a fan through a series of modules of electrical components, the modules being oriented below the fan and vertical and parallel to one another and the baffle arrangement being interposed between the fan and the modules, wherein the baffle arrangement comprises: a series of parallel channels, each channel oriented across approximately half of the modules, a first half of the series of parallel channels running from one end of the series of modules to approximately mid-way across the series of modules and a second half of the series of parallel channels running from a second end of the series of modules to approximately mid-way across the series of modules, each channel being spaced apart from an adjacent channel by approximately the width of a channel, wherein the first half of the series of parallel channels being offset by approximately the width of a channel from the second half of the series of parallel channels such that no channel from the first half of the series of parallel channels is collinear with a channel from the second half of the series of channels.

According to another broad aspect, the invention provides an apparatus comprising: a fan; a series of modules of electrical components, the modules being oriented below the fan and vertical and parallel to one another; a baffle arrangement interposed between the fan and the modules; a cabinet housing the fan, the series of modules and the baffle arrangement; wherein the baffle arrangement comprises: a series of parallel channels, each channel oriented across approximately half of the modules, a first half of the series of parallel channels running from one end of the series of modules to approximately mid-way across the series of modules and a second half of the series of parallel channels running from a second end of the series of modules to approximately mid-way across the series of modules, each channel being spaced apart from an adjacent channel by approximately the width of a channel, wherein the first half of the series of parallel channels being offset by approximately the width of a channel from the second half of the series of parallel channels such that no channel from the first half of the series of parallel channels is collinear with a channel from the second half of the series of channels.

Advantages of the present invention include a relatively simple and inexpensive technique for evenly distributing air flow through electronic modules, regardless of the position of one or more fans used to draw air through the modules. Where two or more fans are used to produce air flow through the modules and one fan fails, the technique allows the modules to continue to function because the remaining fan(s) continue to produce even air flow through the modules.

BRIEF DESCRIPTION OF THE DRAWINGS

Preferred embodiments of the invention will now be described with reference to the attached drawings in which

FIG. 2b is a vertical sectional view along line B—B of FIG. 2a;

FIG. 2c is a vertical sectional view along line C—C of FIG. 2a;

DETAILED DESCRIPTION OF THE PREFERRED EMBODIMENTS

Figure 1:
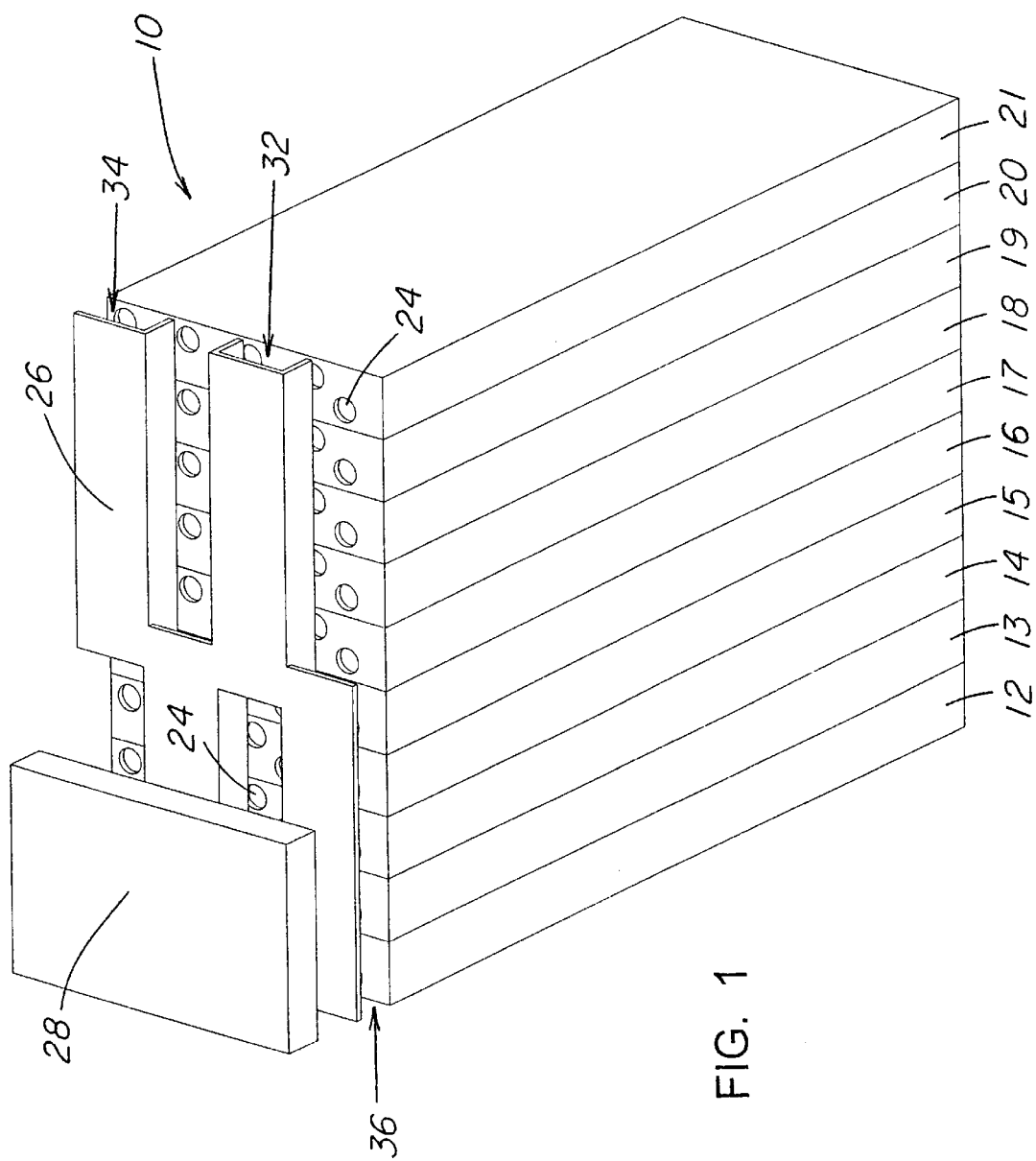
FIG. 1 is a perspective view of an electronics system incorporating a baffle arrangement according to an embodiment of the present invention.
Figure 2A:
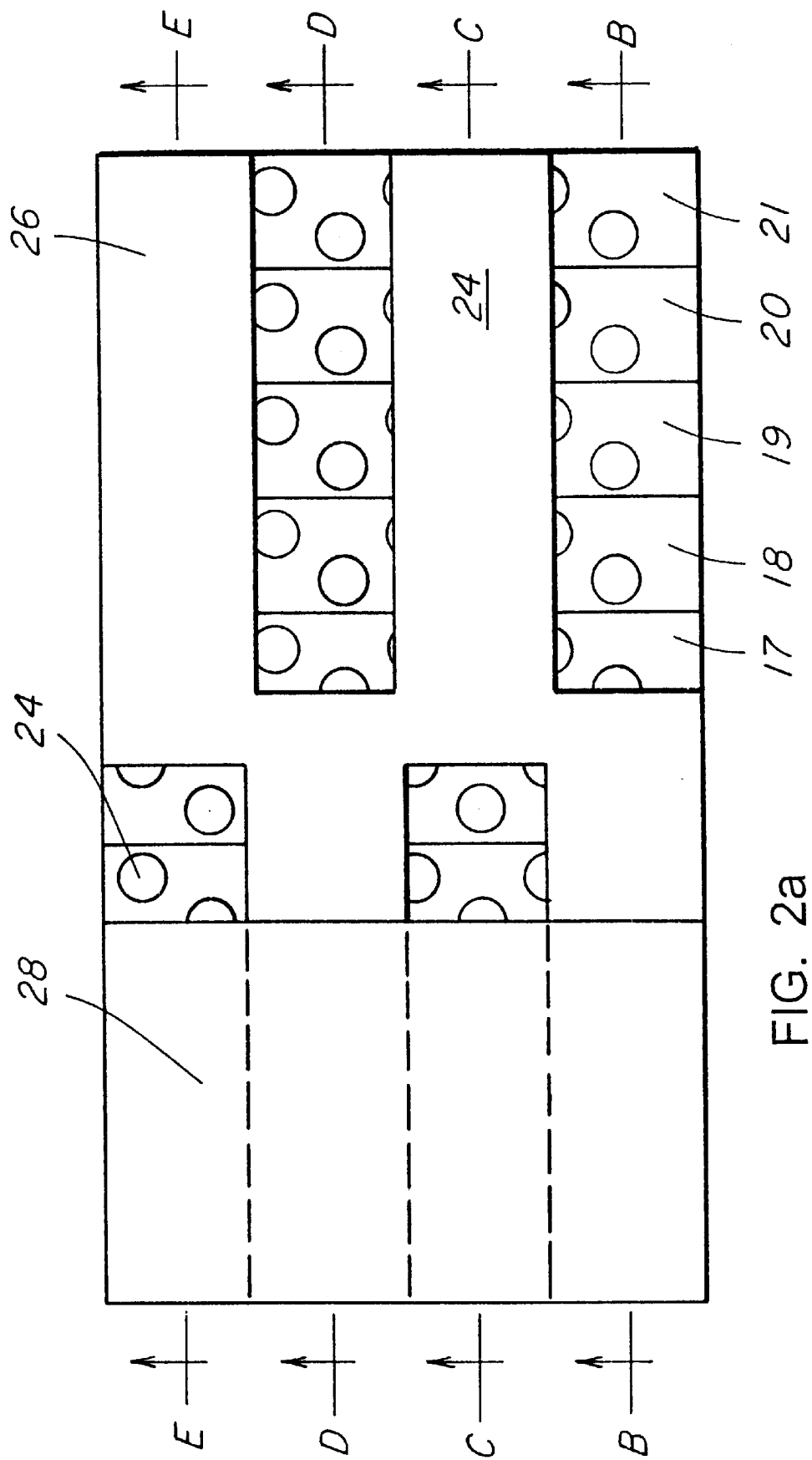
FIG. 2a is a top view of the embodiment of FIG. 1, but drawn to a larger scale.

A perspective view of an electronics system, generally designated 10, is shown FIG. 1. A top view of the system is shown in FIG. 2a. Modules 12–21 are shown, oriented vertically, one beside the other. (10 modules are illustrated in the figures for example purposes only. Any number of modules could be used.) Each module, typically made of stainless steel, will typically contain one printed circuit board (not shown) on which are mounted electronic components. Each module has openings 24 on its upper surface to permit air to flow out. Similarly, each module has openings (not shown) on its lower surface to permit air to flow into the module.

The electronics system 10 is typically housed within a chassis or cabinet (not shown) which is made of stainless steel or other suitable materials, which has walls around the modules 12–21 and baffles 26.

A baffle arrangement 26 is located above modules 12–21. The arrangement of baffles 26 could be a single piece of plastic or metal or it could be a number of pieces, assembled to appear the same as or similar to the arrangement 26 shown in FIG. 1. The baffles 26 can either rest directly on top of modules 12–21 or else the baffles can be suspended from the chassis by plastic snap fits 1 or 2 mm above the modules 12–21.

One or more fans 28 are suspended from the chassis above the baffles 26. In the representation of the system 10 shown in FIG. 1, only a single fan 28 is shown. However, two or more fans 28 could be used over modules 12–21. As well, the one or more fans 28 can be located over any of the modules 12–21, and need not be located over modules 12–14 as shown in the Figures.

Figure 2B:
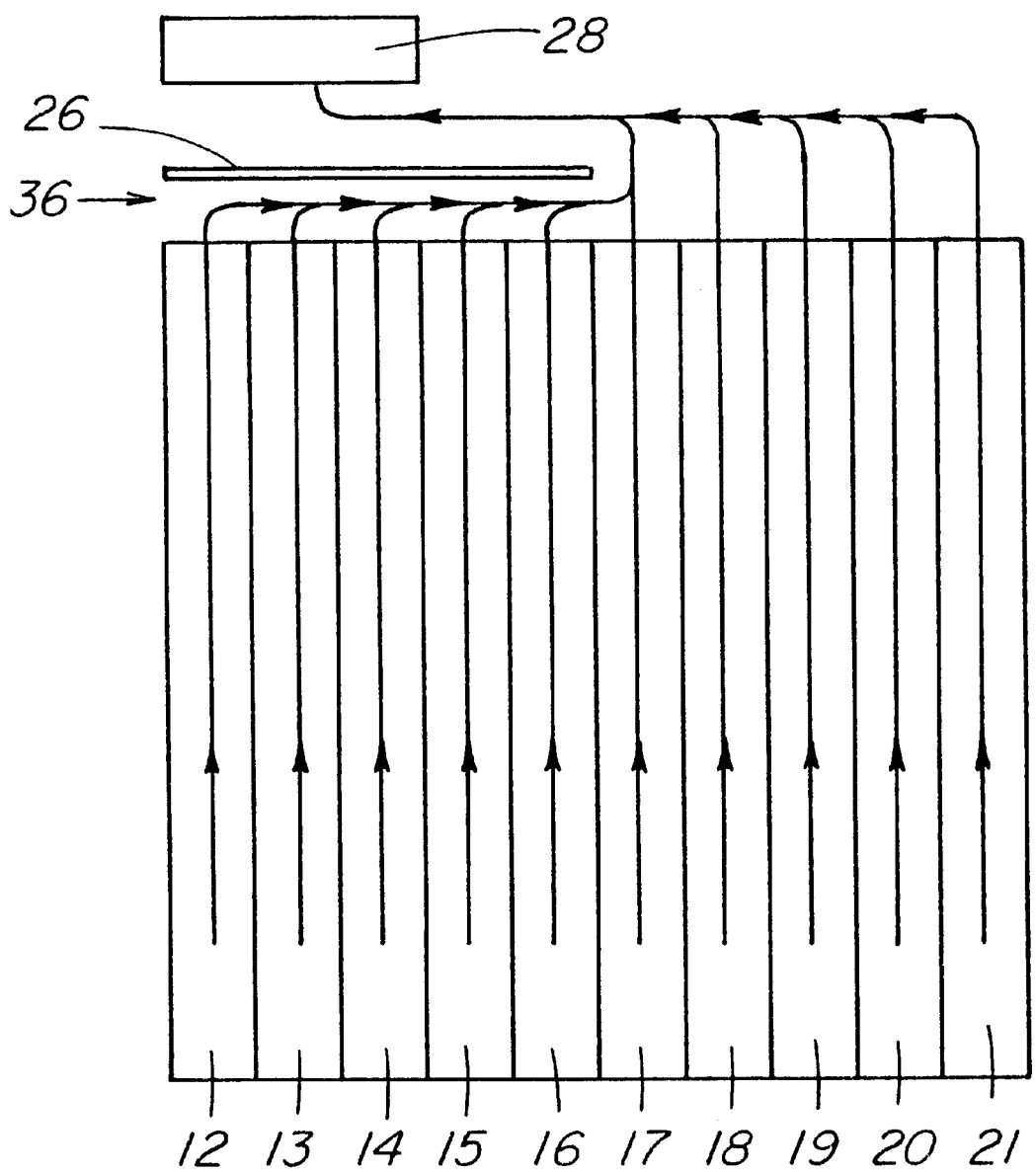
Figure 2C:
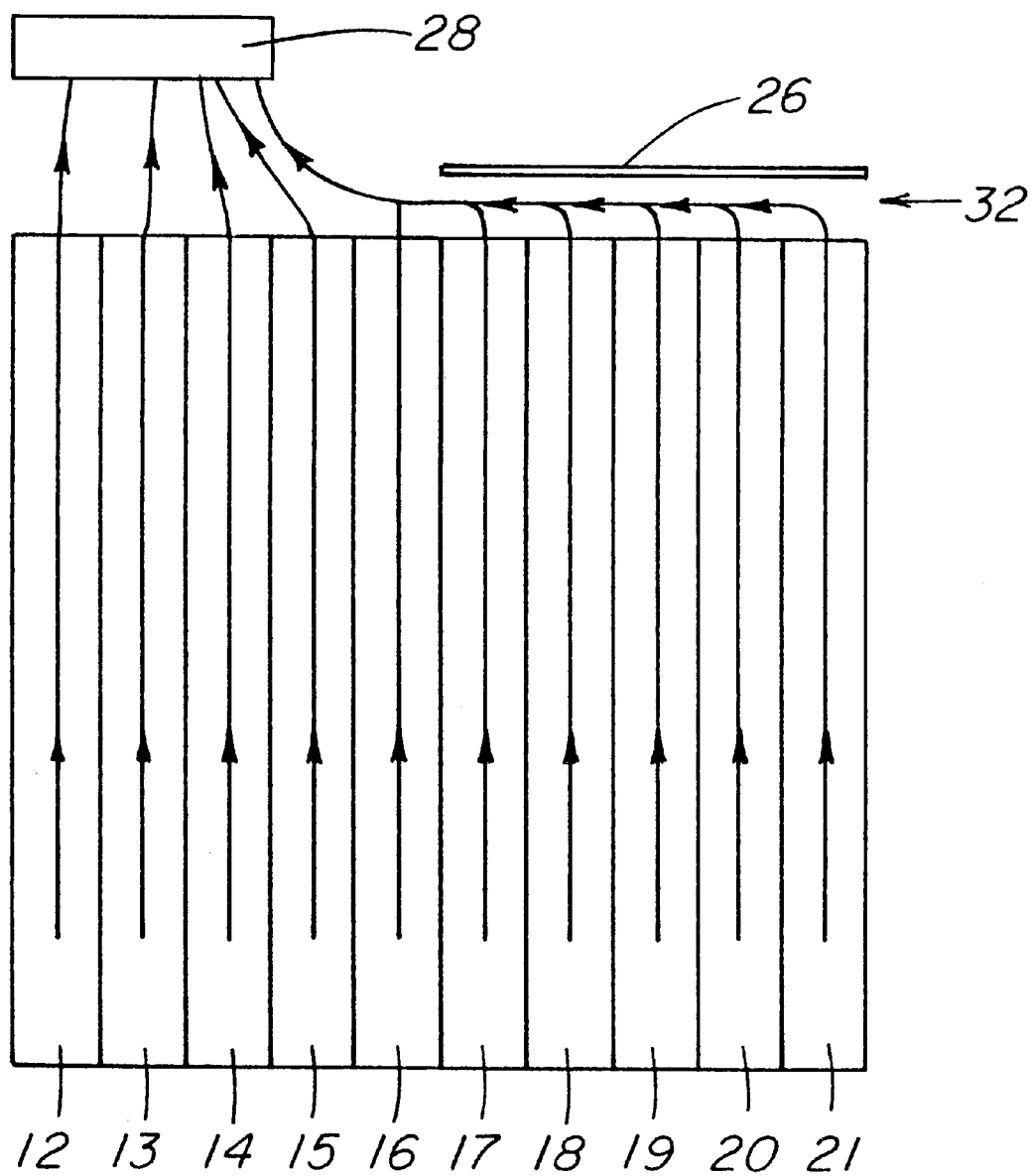
Figure 3:
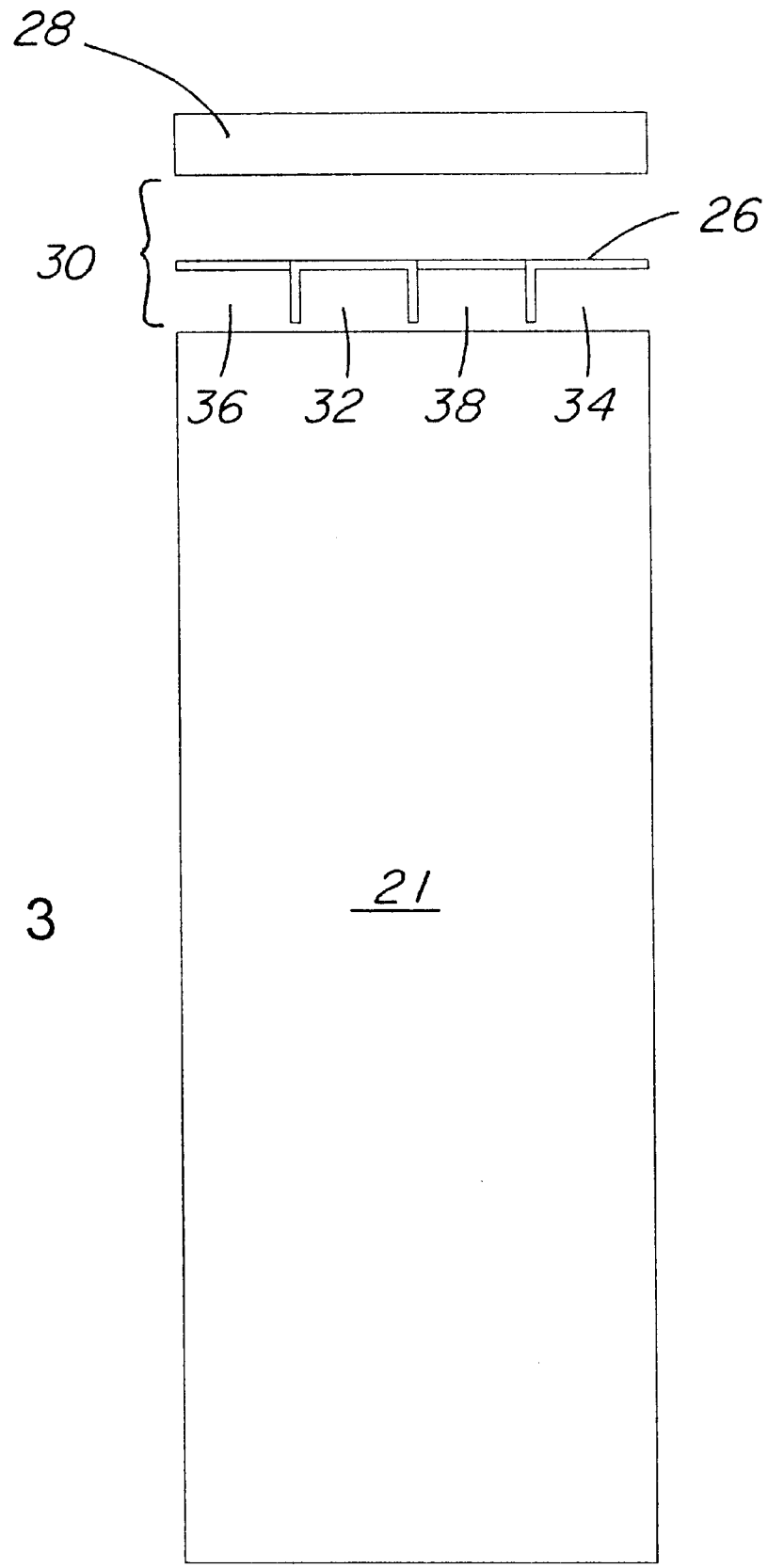
FIG. 3 is a side view of the embodiment of FIG. 1.

As shown in FIG. 3, which is a side view of system 10, there is an air plenum 30 between the top surface of modules 12–21 and the lower surface of fan 28. FIG. 3 also shows baffle channels 32, 34, 36, 38 formed in the under surface of baffles 26. Baffle channels 32, 34 form channels over modules 17–21, as shown in FIGS. 1 and 2a–2c. Baffle channels 36, 38, as seen in FIG. 3, are channels formed over modules 12–16.

In the preferred embodiment, as also shown in FIG. 3, each of baffle channels 32 and 38 has an inverted U-shape in cross-section taken along the width of each channel. Each of baffle channels 34 and 36 (the outermost channels), in cross-section taken along the width of each channel, is shaped as a right angle. The inside walls of the chassis run along the outer edges of baffle channels 34 and 36 so that, in cross-section taken along the width of each channel 34, 36, the channels when seen in combination with the inside walls of the chassis, have an inverted U-shape, similar to baffle channels 32, 38.

In top or perspective view, as seen in FIGS. 1 and 2a, each baffle channel 32–38 is arranged to run across approximately half of the modules 12–21. Baffle channels 32, 34 run from module 21 (one end of the series of modules 12–21) to approximately half-way across the series of modules 12–21 (to module 16 in this example). The other two baffle channels 36, 38 run from module 12 (the other end of the series of modules 12–21) to approximately half-way across the series of modules 12–21 (to module 16 in this example).

As shown in FIGS. 1 and 2a, the width of each baffle channel 32–38 is approximately one quarter the length across the top of a module. Each baffle channel 32–38 is spaced apart from an adjacent channel by approximately the width of a channel. Further, as shown in FIGS. 1 and 2a, no two baffle channels are collinear.

The baffles 26 direct air flow. In the example system 10 shown in FIG. 1, the fan 28 is suspended over modules 12–14. If there were no baffles 26, the fan 28 would only effectively draw air from modules directly below fan 28, which in this example, would be modules 12–14.

As shown in FIGS. 2b–2c, the arrangement of baffles 26 causes the flow of air to be diverted from the path it would otherwise take. FIG. 2b is a vertical sectional view of the system along line B—B of FIG. 2a showing the flow of air up through the modules 21—21 and into the fan 28 (the flow of air is shown by the lines with arrows). Because, in the preferred embodiment, there is a chassis (not shown) surrounding the modules 12–21, as noted above, a wall of the cabinet prevents air from being drawn to left (as seen in FIG. 2b) through channel 36.

As shown in FIG. 2b, the air from modules 12 and 13, for example, cannot flow directly into the fan 28 because of the obstruction caused by baffle 26. Accordingly, air from modules 12 and 13 must flow along the length of baffle channel 36 (which in this example ends above module 17) and then the air can flow into the fan 28. The air from modules 20 and 21, for example, flows relatively directly into fan 28 because there is no baffle to interfere with the flow.

FIG. 2c is a vertical sectional view of the system along line C—C of FIG. 2a (with the fan 28 added). As shown in FIG. 2c, air flowing from modules directly below the fan 28 (namely modules 12–14) flows directly into fan 28. Air flowing from modules 20 and 21, for example, flows though baffle channel 32 and then into fan 28.

Accordingly, the air flow is different along the vertical sectional line B—B of FIG. 2a than along vertical sectional line C—C of FIG. 2a.

The vertical sectional view along line D—D of FIG. 2a is essentially the same as the view shown in FIG. 2b. Similarly, the vertical sectional view along line E—E of FIG. 2a is essentially the same as the view shown in FIG. 2c.

By the use of baffles 26, air is unable to flow directly from modules 12–14 to the fan 28, as it would in the absence of the baffles 26. In other words, while the air under line C—C of FIG. 2a flows directly from modules 12–14 to the fan 28, the air under line B—B must flow further (first along and then over baffle channel 36) in order to reach the fan 28.

The baffles 26 therefore reduce the flow of air (the velocity of the air) through modules 12–14 and also reduce the volume of air that can flow from modules 12–14 to the fan 28. By reducing the flow of air through modules 12–14 and by increasing the flow resistance through modules 12–14, more air can be drawn from the modules that are further away from the fan 28.

With the use of baffle arrangement 26, each module will have two different flow rates, corresponding to the distance the air must flow to reach the fan 28. An example can been seen by reference to FIGS. 2a–2c and by considering module 12. For module 12, air below lines B—B and D—D of FIG. 2a follows the path shown in FIG. 2b. Accordingly, the air below lines B—B and D—D of FIG. 2a will have essentially the same flow rate. Below lines C—C and E—E of FIG. 2a, the air from module 12 will follow the path shown in FIG. 2c. While the air below lines C—C and E—E of FIG. 2a will have essentially the same flow rate, the flow rate will be different from the flow rate below line B—B and D—D.

As a result of the configuration of baffles 26, the average distance air flows from each module to the fan 28 is approximately the same. For example, the average distance of the path of airflow from module 12 to the fan= distance of air flow under line B—B of FIG. 2a to fan+
distance of air flow under line C—C of FIG. 2a to fan+
distance of air flow under line D—D of FIG. 2a to fan+
distance of air flow under line E—E of FIG. 2a to fan divided by 4.

(This is the same as multiplying the distance of the path for module 12 shown in FIG. 2b by 2, adding this value to twice the distance of the path for module 12 shown in FIG. 2c, and dividing the result by 4.)

This value is approximately the same for each module, as can be easily determined by performing the above calculation for any other module. This result means that each module has, on average, approximately the same rate of flow of air through it. Since the degree to which a module is cooled is directly proportional to the rate of flow of air through it, and since all modules have approximately the same rate of flow of air, each module should be cooled by approximately the same amount.

The same result occurs regardless of the position of the fan over the modules. In other words, although the fan appears over modules 12–14 in FIG. 1, the invention would work equally well if the fan were located over any other modules.

Where one or more of modules 12–21 is missing, either a dummy module can be inserted in place of the missing module or else a barrier (not shown) can be placed where the top surface of the missing module would be. The barrier would preferably prevent any air from flowing through it to help maximize airflow through the "real" modules.

The above description has considered baffles 26 which have been preformed in the configuration shown in FIGS. 1–3, as described above. However, according to another embodiment of the invention, the insertion of modules 12–21 into position in the cabinet (not shown) could also cause the baffles to orient properly to produce the configuration of baffles 26 shown in FIG. 1. Using this embodiment, there is no need to add dummy modules or barriers where one or more modules is missing. This embodiment may be referred to as the moving baffles embodiment.

Figure 5A:
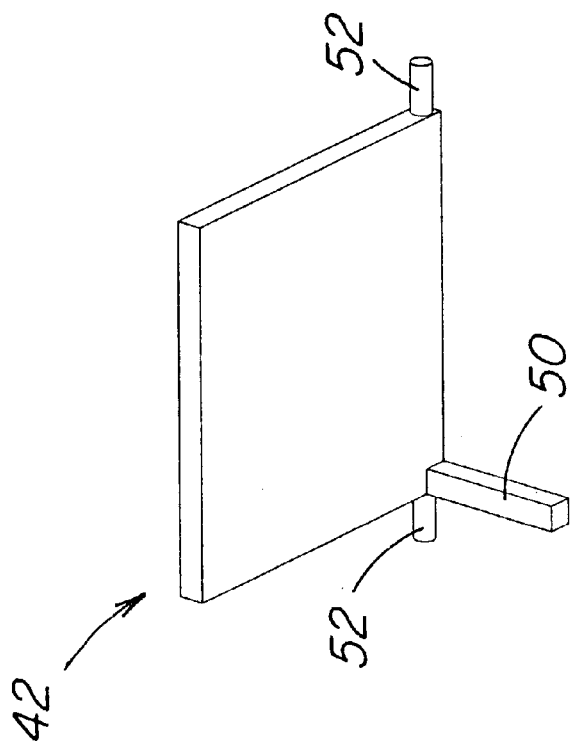
FIGS. 5a and 5b are bottom perspective and top perspective views of one type of baffle door shown in FIGS. 4a–4c.
Figure 5B:
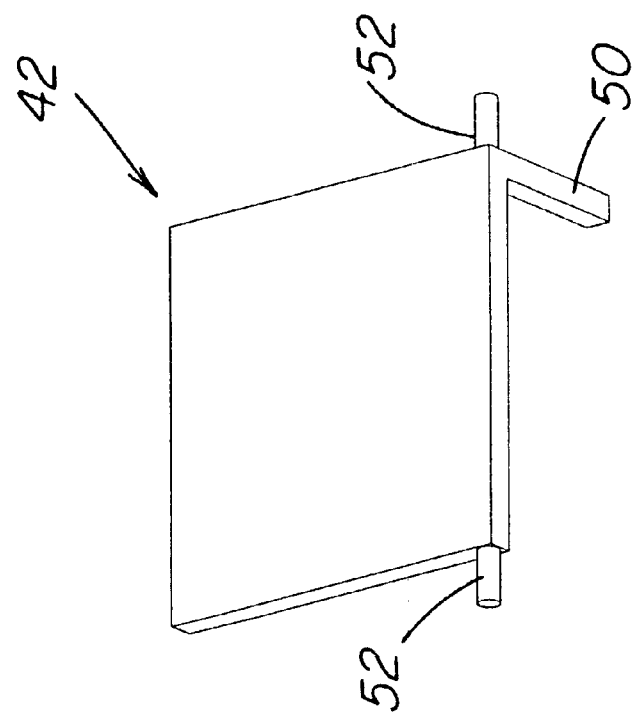

There are two different types of baffle doors used in the moving baffles embodiment. Baffle door 42, as shown in bottom perspective and top perspective views in FIGS. 5a and 5b, respectively, represents one type of door and baffle door 44 represents a second type of baffle door. Baffle door 42 has a length and width which are each approximately the width of a baffle channel. Baffle door 42 is pivotally connected to pivot rod 52. Baffle door 42 also has a leg 50 which projects perpendicularly from a lower surface of baffle door 42 near pivot rod 52. The length of the leg 50 is less than the width of a baffle channel.

Figure 6A:
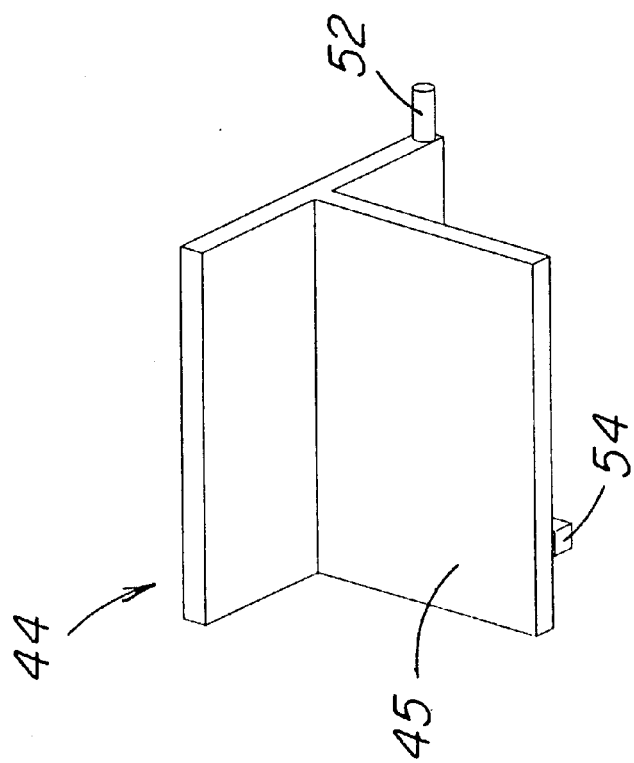
FIGS. 6a and 6b are bottom perspective and top perspective views of a second type of baffle door shown in FIGS. 4a–4c.
Figure 6B:
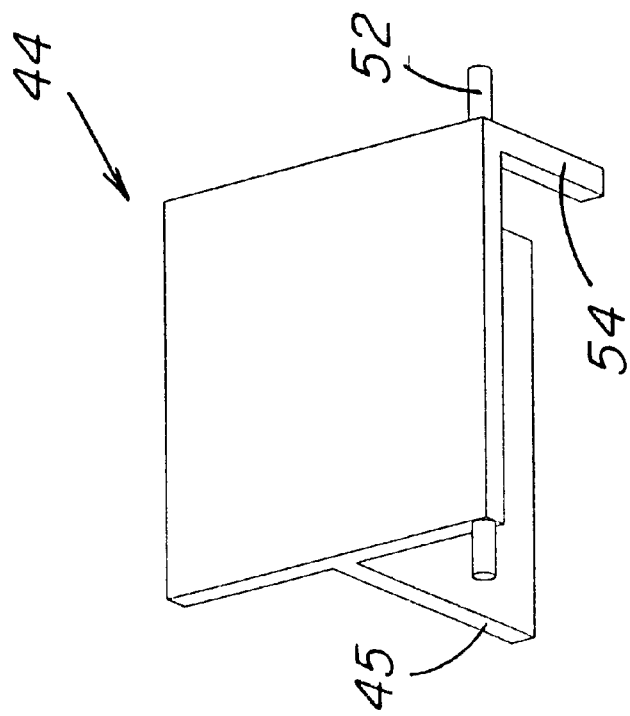

Baffle door 44, as shown in bottom perspective and top perspective views in FIGS. 6a and 6b, respectively, is an example of the second type of baffle door. Baffle door 44 comprises, in addition to leg 54, two portions, joined at right angles. A first portion of door 44 is essentially the same as door 42. A second portion of door 44, portion 45, has essentially the same dimensions as the first portion, and extends at right angles from the first portion, across the width of the of the bottom surface of the first portion, part-way along the length of the first portion.

Figure 4A:
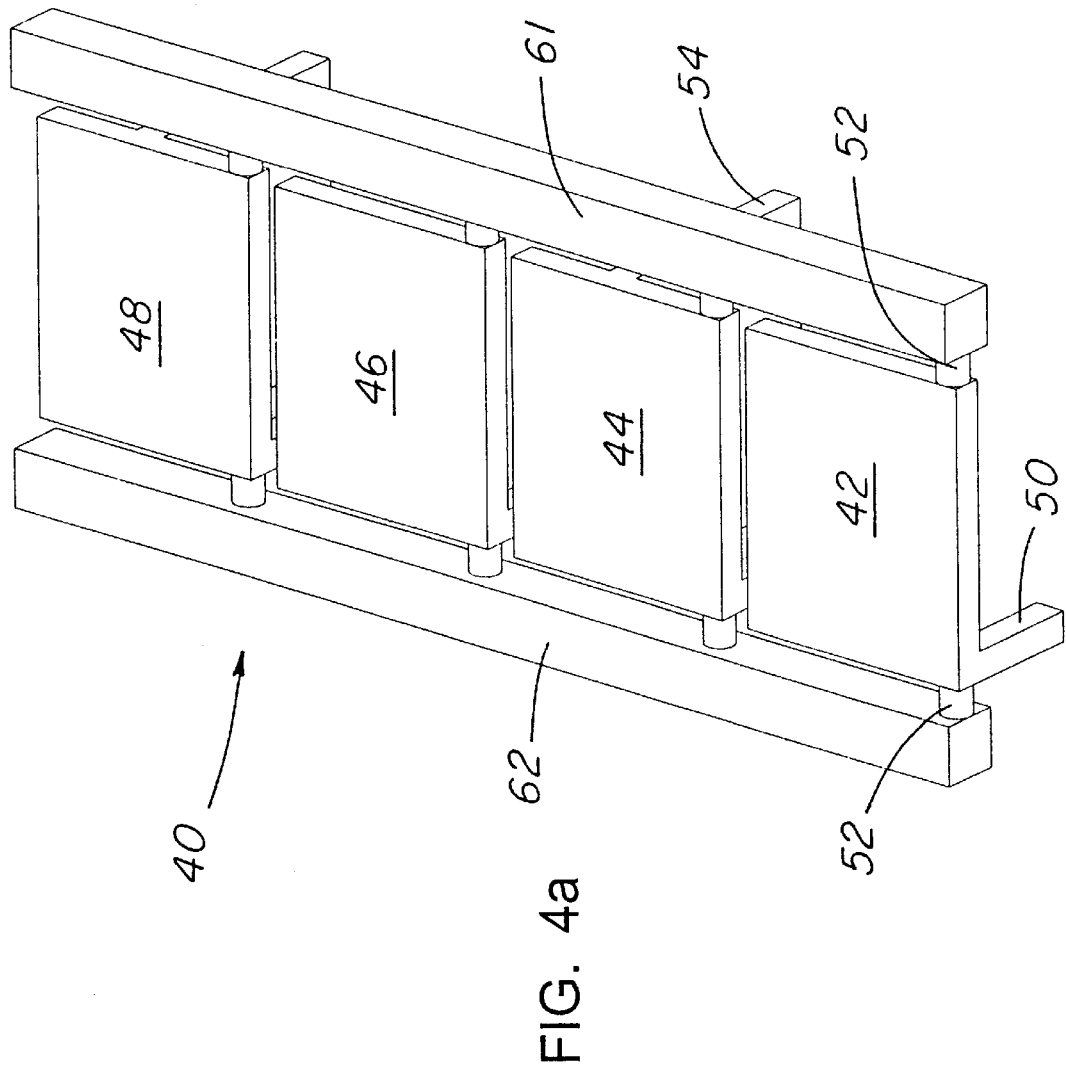
FIG. 4a is a perspective view of baffle doors, in the closed position, according to another embodiment of the present invention.

An example of the moving baffles embodiment is described with reference to module 21 (the resulting baffle arrangement will appear similar to the baffle arrangement 26 shown in FIG. 1). For this example, module 21 is to be slid into place alongside the other modules 12–20. Before module 21 is slid into place, the baffle arrangement 40, as shown in perspective view in FIG. 4a, is in a closed position. As module 21 is slid into place beside the other modules (ie: module 21 is slid horizontally parallel to module 20), each baffle door 42–48 is pivoted into place. Preferably, baffle guides 61, 62 may be used to guide module 21 into place, as shown in FIGS. 4b and 4c.

Figure 4B:
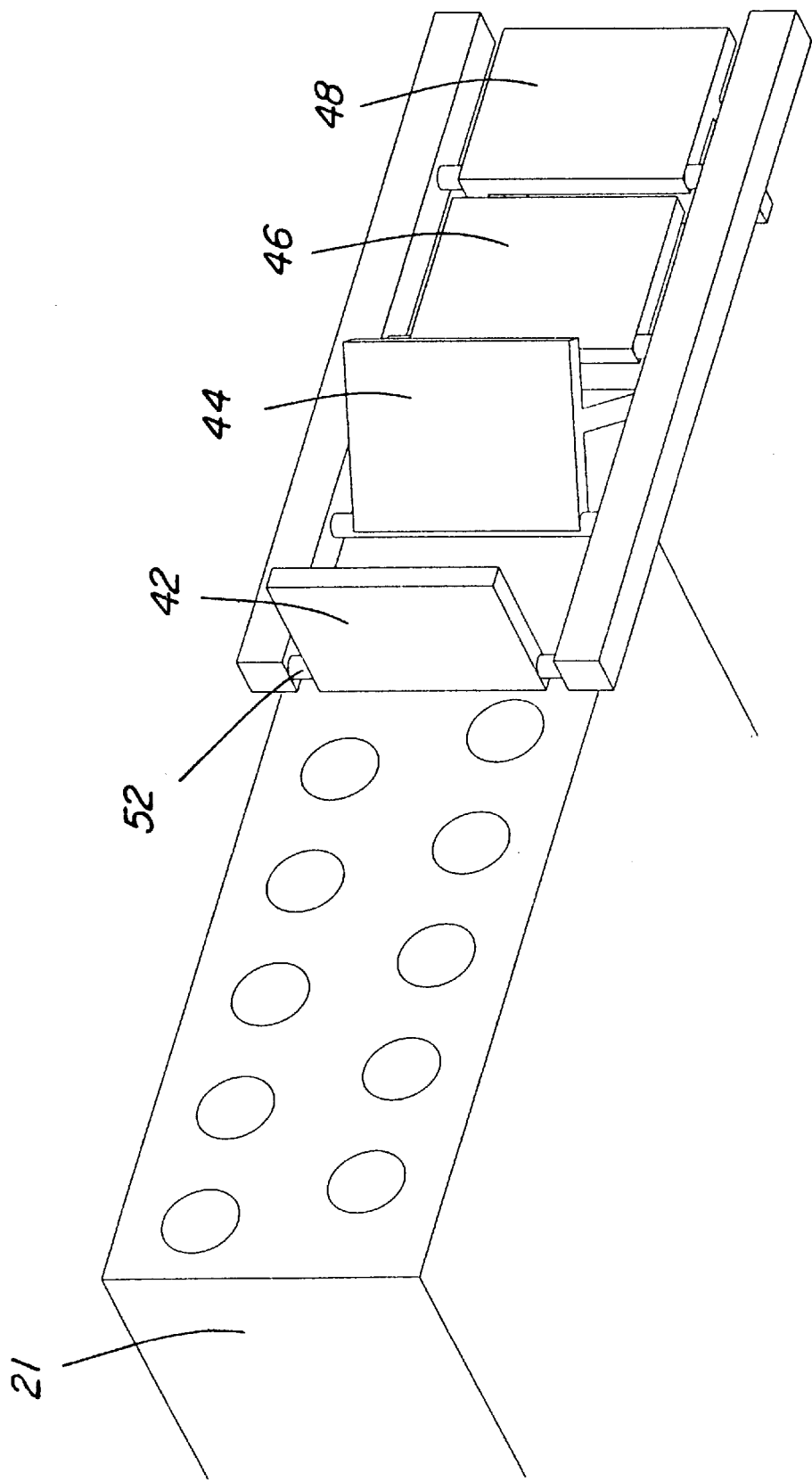
FIG. 4b is a view similar to FIG. 4a, but illustrating the baffle doors opening as a module is slid into place.
Figure 4C:
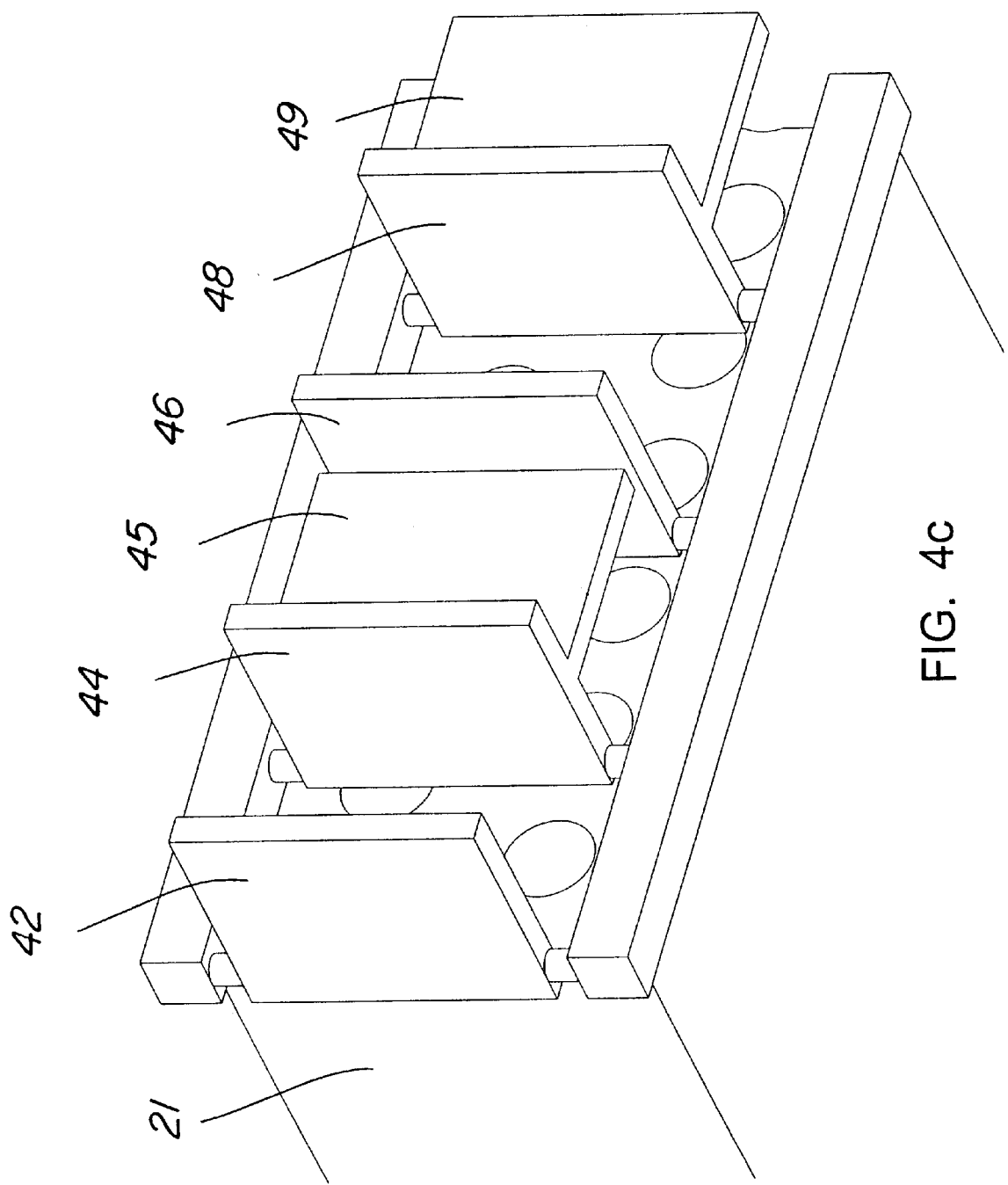
FIG. 4c is a view similar to FIG. 4a but showing the baffle doors in the open position.

FIG. 4b shows the baffle arrangement 40, in perspective view, as module 21 is slid into place alongside module 20. As shown in FIG. 4a, before module 21 is slid into place, baffle door 42 is in the closed position. As module 21 slides past baffle door 42, module 21 pushes leg 50 of door 42, causing the door 42 to pivot around pivot rod 52. Door 42 in the open position appears in FIG. 4b. From the closed position shown in FIG. 4a to the open position shown in FIG. 4b, baffle door 42 pivots 90 degrees.

FIG. 4b shows baffle door 44 partially opened as module 21 is slid under it. As shown in FIG. 4a, before module 21 is slid into place, baffle door 44 is in the closed position. As module 21 slides past baffle door 44, module 21 pushes leg 54 of door 44, causing the door 44 to pivot around pivot rod 56. FIG. 4c shows the baffle arrangement 40, in perspective view, in the open position.

Baffle door 46 has the same configuration as baffle door 42. Baffle door 48 has the same configuration as baffle door 48.

After module 21 has been slid into place, baffle doors 44 and 46 combine to form part of baffle channel 32 (as shown in FIGS. 1 and 3). Similarly, baffle door 48 forms part of baffle channel 34 (a wall of the cabinet (not shown) surrounding modules 12–21 forms the far wall (not shown) of baffle channel 34.)

Numerous modifications and variations of the present invention are possible in light of the above teachings. For example, the baffle arrangement 26 could conceivably incorporate any number of baffle channels, although, ideally, the number of baffle channels will be even to produce more even airflow through all the modules. It is therefore to be understood that within the scope of the appended claims, the invention may be practised otherwise than as specifically described herein.

What we claim as our invention is:

1. A baffle arrangement to help increase the evenness of distribution of air drawn by a fan through a series of modules of electrical components, the modules being oriented below the fan and vertical and parallel to one another and the baffle arrangement being interposed between the fan and the modules, wherein the baffle arrangement comprises:

a series of parallel channels, each channel oriented across approximately half of the modules, a first half of the series of parallel channels running from one end of the series of modules to approximately mid-way across the series of modules and a second half of the series of parallel channels running from a second end of the series of modules to approximately mid-way across the series of modules, each channel being spaced apart from an adjacent channel by approximately the width of a channel, wherein the first half of the series of parallel channels being offset by approximately the width of a channel from the second half of the series of parallel channels such that no channel from the first half of the series of parallel channels is collinear with a channel from the second half of the series of channels.

2. The baffle arrangement of claim 1 wherein air drawn from directly below a channel must travel through the channel to an end of the channel approximately mid-way across the series of modules prior to being drawn into the fan.

3. The baffle arrangement of claim 1 wherein each channel, in cross-section across its width, is generally an inverted U-shape.

4. The baffle arrangement of claim 1 wherein each channel, in cross-section across its width, except for the two outermost channels, is generally an inverted U-shape, each of the two outermost channels having a right angle shape in cross-section across its width.

5. The baffle arrangement of claim 1 wherein the channels are formed by a series of baffle doors pivotable into position as the modules are slid into place under the baffle doors.

6. The baffle arrangement of claim 5 comprising two types of baffle doors, a first type of baffle door comprising a rectangular portion and a leg portion, the rectangular portion having top and bottom surfaces and a first end, the length and the width of the rectangular portion each being approximately the width of a channel and wherein the leg portion projects from the bottom surface near the first end of the rectangular portion, at right angles to the bottom surface;

a second type of baffle door being generally the same dimensions as the first type of baffle door and further comprising a second generally rectangular portion having a length and a width each approximately the width of a channel and projecting across the width of the bottom surface of the rectangular portion part-way along the length of the lower surface, wherein for each of the modules from one end of the series of modules to approximately mid-way across the series of modules, the baffles doors are arranged, along the length of each module, in repeating order, a first type of baffle door followed by a second type of baffle door and for each of the modules from the other end of the series of modules to approximately mid-way across the series of modules, the baffle doors are arranged, along the length of each module, in repeating order, a second type of baffle door followed by a first type of baffle door, wherein each door is pivotally connected along its first end and as a module is slid into place below the door, the module sliding by the leg portion of the baffle door causes the door to pivot ninety degrees.

7. An apparatus comprising:

a fan;

a series of modules of electrical components, the modules being oriented below the fan and vertical and parallel to one another;

a baffle arrangement interposed between the fan and the modules;

a cabinet housing the fan, the series of modules and the baffle arrangement;

wherein the baffle arrangement comprises:

a series of parallel channels, each channel oriented across approximately half of the modules, a first half of the series of parallel channels running from one end of the series of modules to approximately mid-way across the series of modules and a second half of the series of parallel channels running from a second end of the series of modules to approximately mid-way across the series of modules, each channel being spaced apart from an adjacent channel by approximately the width of a channel, wherein the first half of the series of parallel channels being offset by approximately the width of a channel from the second half of the series of parallel channels such that no channel from the first half of the series of parallel channels is collinear with a channel from the second half of the series of channels.

8. The apparatus of claim 7 wherein air drawn from directly below a channel must travel through the channel to an end of the channel approximately mid-way across the series of modules prior to being drawn into the fan.

9. The apparatus of claim 7 wherein each channel, in cross-section across its width, is generally an inverted U-shape.

10. The apparatus of claim 7 wherein each channel, in cross-section across its width, except for the two outermost channels, is generally an inverted U-shape, each of the two outermost channels having a right angle shape in cross-section across its width.

11. The apparatus of claim 7 wherein the channels are formed by a series of baffle doors pivotable into position as the modules are slid into place under the baffle doors.

12. The apparatus of claim 11 comprising two types of baffle doors, a first type of baffle door comprising a rectangular portion and a leg portion, the rectangular portion having top and bottom surfaces and a first end, the length and the width of the rectangular portion each being approximately the width of a channel and wherein the leg portion projects from the bottom surface near the first end of the rectangular portion, at right angles to the bottom surface;

a second type of baffle door being generally the same dimensions as the first type of baffle door and further comprising a second generally rectangular portion having a length and a width each approximately the width of a channel and projecting across the width of the bottom surface of the rectangular portion part-way along the length of the lower surface, wherein for each of the modules from one end of the series of modules to approximately mid-way across the series of modules, the baffles doors are arranged, along the length of each module, in repeating order, a first type of baffle door followed by a second type of baffle door and for each of the modules from the other end of the series of modules to approximately mid-way across the series of modules, the baffle doors are arranged, along the length of each module, in repeating order, a second type of baffle door followed by a first type of baffle door, wherein each door is pivotally connected along its first end and as a module is slid into place below the door, the module sliding by the leg portion of the baffle door causes the door to pivot ninety degrees.

13. The apparatus of claim 7 wherein each module comprises openings in its top and bottom surface to permit air to flow therethrough.

* * * * *